(12) United States Patent
Gani et al.

(10) Patent No.: US 7,910,488 B2
(45) Date of Patent: Mar. 22, 2011

(54) ALTERNATIVE METHOD FOR ADVANCED CMOS LOGIC GATE ETCH APPLICATIONS

(75) Inventors: Nicolas Gani, San Jose, CA (US); Meihua Shen, Fremont, CA (US); Shashank Deshmukh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 848 days.

(21) Appl. No.: 11/777,259

(22) Filed: Jul. 12, 2007

(65) Prior Publication Data

US 2009/0017633 A1 Jan. 15, 2009

(51) Int. Cl.
*H01L 21/302* (2006.01)

(52) U.S. Cl. ........ 438/714; 438/689; 438/702; 257/369; 257/407; 257/412

(58) Field of Classification Search ................. 438/689, 438/702, 714; 257/369, 407, 412
See application file for complete search history.

(56) References Cited

U.S. PATENT DOCUMENTS

| | | | |
|---|---|---|---|
| 5,880,033 A * | 3/1999 | Tsai ........................... | 438/710 |
| 6,380,031 B1 | 4/2002 | Mehrad et al. | |
| 6,399,432 B1 | 6/2002 | Zheng et al. | |
| 6,861,712 B2 * | 3/2005 | Gao et al. ..................... | 257/369 |
| 7,435,652 B1 * | 10/2008 | Chen et al. .................... | 438/275 |
| 2004/0007561 A1 | 1/2004 | Nallan et al. | |
| 2005/0164479 A1 | 7/2005 | Perng et al. | |
| 2007/0048920 A1 | 3/2007 | Song et al. | |
| 2007/0059874 A1 | 3/2007 | Moumen et al. | |
| 2007/0134922 A1 * | 6/2007 | Mori et al. .................... | 438/689 |
| 2007/0210389 A1 | 9/2007 | Ramaswamy et al. | |

FOREIGN PATENT DOCUMENTS

| | | |
|---|---|---|
| WO | 2007025277 A2 | 3/2007 |
| WO | 2007038161 A1 | 4/2007 |

OTHER PUBLICATIONS

Layadi Nace et al. Bell Labs Technical Journal Jul./Sep. 1999, pp. 155-171.*

* cited by examiner

*Primary Examiner* — Shamim Ahmed
*Assistant Examiner* — Maki A Angadi
(74) *Attorney, Agent, or Firm* — Moser IP Law Group (57) ABSTRACT

Methods for etching, such as for fabricating a CMOS logic gate are provided herein. In some embodiments, a method of etching includes (a) providing a substrate having a first stack and a second stack disposed thereupon, the first stack comprising a high-k dielectric layer, a metal layer formed over the high-k dielectric layer, and a first polysilicon layer formed over the metal layer, the second stack comprising a second polysilicon layer, wherein the first and second stacks are substantially equal in thickness; (b) simultaneously etching a first feature in the first polysilicon layer and a second feature in the second polysilicon layer until the metal layer in the first stack is exposed; (c) simultaneously etching the metal layer and second polysilicon layer to extend the respective first and second features into the first and second stacks; and (d) etching the high-k dielectric layer.

30 Claims, 4 Drawing Sheets

ALTERNATIVE METHOD FOR ADVANCED CMOS LOGIC GATE ETCH APPLICATIONS

BACKGROUND

1. Field

Embodiments of the present invention generally relate to the field of semi-conductor processing, and more particularly to etching of logic gates.

2. Description of the Related Art

Ultra-large-scale integrated (ULSI) circuits may include more than one million electronic devices (e.g., transistors) that are formed on a semiconductor substrate, such as a silicon (Si) substrate, and cooperate to perform various functions within the device. Typically, the transistors used in the ULSI circuits are complementary metal-oxide-semiconductor (CMOS) field effect transistors. In one common application, CMOS transistors may be arranged to form CMOS logic gates. CMOS logic applications use a combination of p-type metal-oxide-semiconductor field-effect transistors (PMOS) and n-type metal-oxide-semiconductor field-effect transistors (NMOS).

The NMOS and PMOS transistors typically include a source region, a drain region, and a channel region between the source and drain. In the PMOS transistor, a gate structure including a polysilicon gate electrode may be disposed above the channel region and separated therefrom by a gate dielectric to control conduction between the source and drain. In the NMOS transistor, a gate structure including a polysilicon on metal gate electrode may be disposed above the channel region and separated therefrom by a high-k gate dielectric to control conduction between the source and drain.

To fabricate a CMOS logic gate as described above, the PMOS and NMOS structures may be simultaneously formed on a substrate. However, etching the dual NMOS/PMOS structures presents a difficulty in stopping the etch process on the thin gate dielectric layer of the PMOS structure during the NMOS poly/metal/hi-k gate etching while maintaining a similar feature profile between the NMOS and PMOS structures due to the exposure of the PMOS structure to the polysilicon/metal gate etch chemistries followed by the high-k gate dielectric etch for the NMOS structure. In addition, maintaining a continuous feature profile at the NMOS polysilicon/metal interface also becomes a challenge due to the etch chemistries involved.

Therefore a need exists for an improved method of fabricating CMOS logic gate structures.

SUMMARY

Methods for etching, such as for fabricating a CMOS logic gate are provided herein. In some embodiments, a method of etching includes (a) providing a substrate having a first stack and a second stack disposed thereupon, wherein the first stack comprises a high-k dielectric layer, a metal layer formed over the high-k dielectric layer, and a first polysilicon layer formed over the metal layer, wherein the second stack comprises a second polysilicon layer, and wherein the first and second stacks are substantially equal in thickness; (b) simultaneously etching a first feature in the first polysilicon layer and a second feature in the second polysilicon layer until the metal layer in the first stack is exposed; (c) simultaneously etching the metal layer and second polysilicon layer to extend the respective first and second features into the first and second stacks; and (d) etching the high-k dielectric layer.

In another aspect of the invention, a method of fabricating a CMOS logic gate is provided. In some embodiments, a method of fabricating a CMOS logic gate includes (a) providing a silicon substrate having an oxide layer and an NMOS stack and a PMOS stack disposed upon the oxide layer, wherein the NMOS stack comprises a high-k dielectric layer formed over the oxide layer, a metal layer formed over the high-k dielectric layer, and a first polysilicon layer formed over the metal layer, and the PMOS stack comprises a second polysilicon layer formed over the oxide layer and the NMOS and PMOS stacks are substantially equal in thickness; (b) simultaneously etching a first feature in the first polysilicon layer and a second feature in the second polysilicon layer until the metal layer is exposed; (c) simultaneously etching the metal layer and second polysilicon layer to extend the respective first and second features into the NMOS and PMOS stacks; (d) plasma etching excess polysilicon in the NMOS and PMOS stacks; and (e) etching the high-k dielectric layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention describes a novel method to simultaneously define NMOS and PMOS gate structures, for example, in CMOS logic gate applications.

Figure 1:
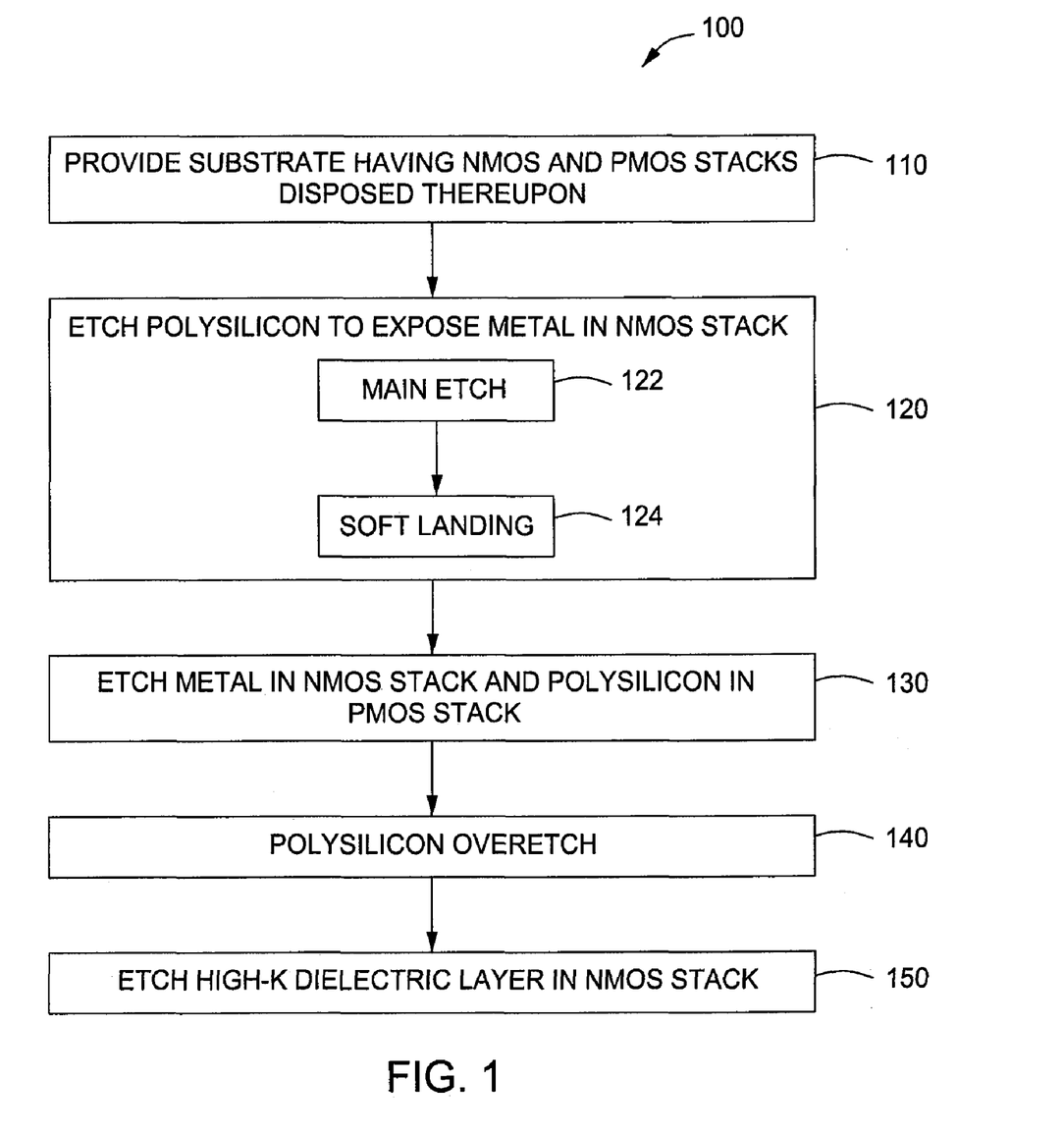
FIG. 1 depicts a flow chart of a method of etching a CMOS structures in accordance with some embodiments of the present invention.

FIG. 1 depicts a method of simultaneously defining NMOS and PMOS gate structures in according with some embodiment of the present invention. The method 100 is described with reference to FIGS. 2A-D, which depict stages of fabrication of the NMOS and PMOS structures. The NMOS and PMOS structures may be etched in accordance with the embodiments of the invention disclosed herein in a suitable etch reactor, for example, as described below with respect to FIG. 3.

Figure 2A:
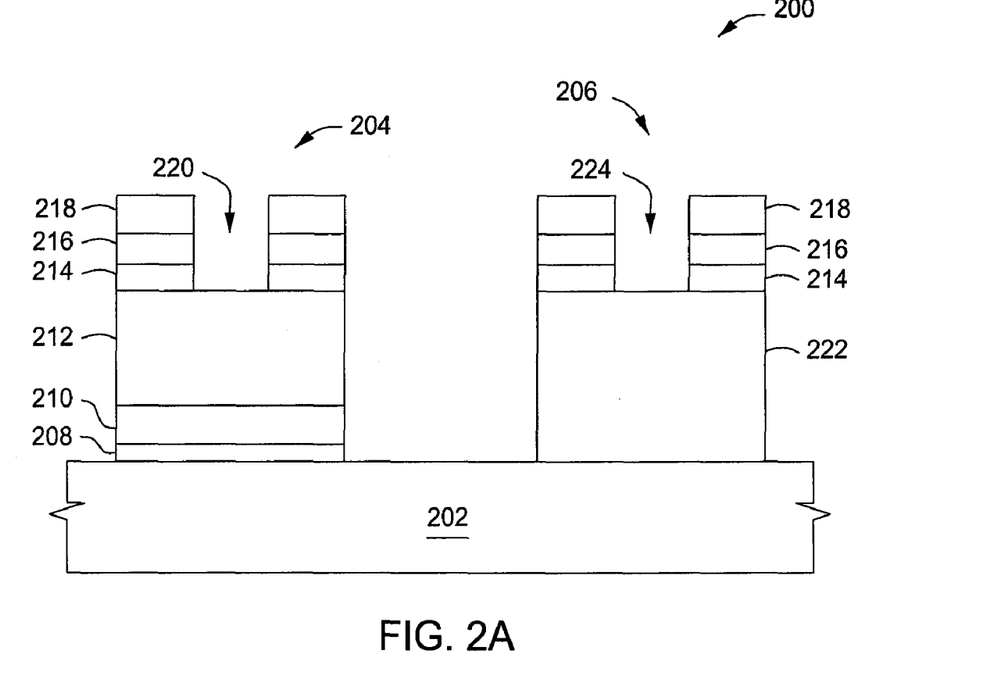
FIGS. 2A-D depict stages of fabrication of a CMOS structure in accordance with the method of FIG. 1.

The method 100 generally begins at 110, where a substrate is provided having NMOS and PMOS structures, or stacks, disposed thereupon. For example, as shown in FIG. 2A, a substrate 200 is shown having a silicon oxide ($SiO_2$) or nitrided silicon oxide (SiON) layer 202 (also referred to as an oxide layer) with an NMOS stack 204 and a PMOS stack 206 formed thereover. Alternatively, the NMOS and PMOS stacks 204, 204 may have independent respective underlying oxide layers formed on the substrate.

In some embodiments, the NMOS stack 204 generally comprises a high-K dielectric layer 208 formed over the oxide layer 202, a metal layer 210 formed over the high-K dielectric layer 208, and a polysilicon layer 214 formed over the metal layer 210. The high-k dielectric layer 208 may comprise a suitable high-k dielectric such as a hafnium-based dielectric (for example, an oxide, silicate, nitride, or oxynitride of hafnium ($HfO_2$, $HfSiO_2$, HfSiN, HfSiON) or the like), a zirconium-based dielectric, or the like. The high-k dielectric layer 208 may be between 10 and 100 Angstroms thick. The metal gate layer 210 may comprise any suitable metal layer, such as tantalum (Ta), titanium (Ti), tungsten (W), nitrides thereof (TaN, TiN, WN), tantalum carbide (TaC), or the like. The metal gate layer 210 is typically between about 70 to 200 Angstroms thick. The polysilicon layer 212 may be between 600 and 1200 Angstroms thick. In one illustrative embodiment, the polysilicon layer 212 may be about 1,000 Angstroms thick, the metal gate layer 210 may comprise a layer of titanium nitride (TiN) about 100 Angstroms thick, and the high-k dielectric layer 208 may comprise a layer of hafnium dioxide ($HfO_2$) about 25 Angstroms thick.

An optional hard mask layer 214, a bottom anti-reflection coating (BARC) layer 216, and a resist layer 218 (or a tri-layer mask scheme) may be formed atop the NMOS and PMOS stacks 204, 206 and may be patterned to form an opening 220 defining a feature to be etched into the NMOS stack 204 and an opening 224 defining a feature to be etched into the PMOS stack 206. The hard mask layer 214 may comprise any suitable hard mask layer, such as silicon oxide ($SiO_2$), silicon oxynitride (SiON), silicon nitride ($Si_3N_4$), or the like.

The PMOS stack generally comprises a polysilicon layer 222 formed over the oxide layer 202. The polysilicon layer 222 may be between about 700 to about 1,200 Angstroms thick. In some embodiments, the difference between the thickness of the polysilicon layer 222 and the polysilicon layer 212 is less than or equal to about 200 Angstroms. It is contemplated that other structures having similar layers of materials, and/or layers of materials having thicknesses varying from the above may be suitably etched in accordance with the methods described herein.

Figure 2B:
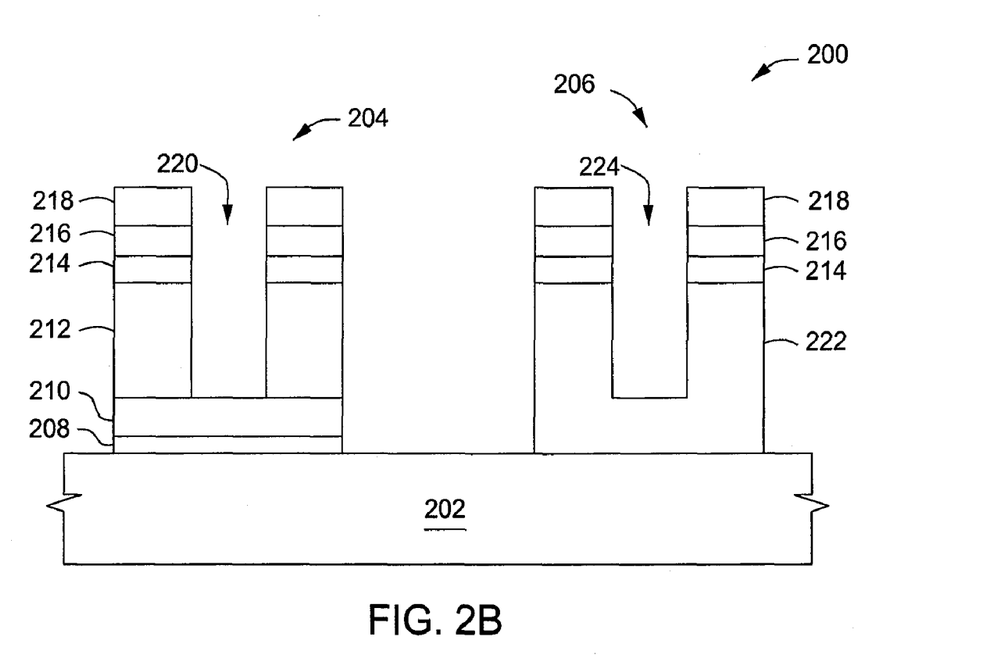

The method continues at 120 wherein the polysilicon layers 212, 222 are etched, as depicted in FIG. 2B. Typically the polysilicon layers 212, 222 may be etched until the metal layer 210 of the NMOS stack 204 is reached. In some embodiments, the polysilicon layers 212, 222 may be etched during a main etch 122 followed by a soft landing 124. Alternatively, in some embodiments, the polysilicon layers 212, 222 may be etched using only the main etch 122.

In one illustrative embodiment, the main etch 122 process is a plasma etch process using a gas comprising at least one of chlorinated/brominated/fluorinated chemistries, such as chlorine ($Cl_2$), hydrogen bromide (HBr), carbon tetrafluoride ($CF_4$), sulfur hexafluoride ($SF_6$), difluoromethane ($CH_2F_2$), nitrogen trifluoride ($NF_3$), or the like. A plasma may be formed by applying source power to an inductively coupled antenna between about 300 and 1200 W. The level of isotropy/anisotropy of the etch may be controlled by applying a cathode bias power between 40 and 150 W. The temperature of the substrate may be maintained between about 30 and 70 degrees Celsius, and the chamber pressure maintained between about 4 and 80 mTorr.

In some embodiments, hydrogen bromide (HBr) may be provided at a rate of about 150 to 400 sccm and chlorine ($Cl_2$) at a rate of about 0 to 120 sccm (e.g., a HBr:$Cl_2$ flow ratio ranging from about 1.5:1 to about 15:1). Optionally, one or more additional passivating gases may be provided, such as oxygen ($O_2$) or helium-oxygen ($HeO_2$) at a rate of about 3 to 20 sccm. In some embodiments, a polymer forming gas, may be provided to facilitate maintaining an acceptable sidewall profile. For example, carbon tetrafluoride ($CF_4$) may be provided at a rate of about 10 to 100 sccm. In some embodiments, a non-halogenated chemistry comprising $SF_6$ provided at a flow rate of between about 20 to 35 sccm and $CH_2F_2$ provided at a flow rate of between about 20 to 40 sccm may also be used. The non-halogenated chemistry may facilitate maintaining an acceptable sidewall profile.

One illustrative process provides HBr at a rate of about 300 sccm, $O_2$ at a rate of about 5 sccm, applies about 400 W of source power and about 60 W of bias power, maintains a substrate temperature of about 60 degrees Celsius, and a pressure of about 6 mTorr. In some embodiments, the process may have a duration of about 60 seconds.

Conventionally, at the conclusion of a conventional polysilicon soft landing process, the profile of the opening 220 may be slightly tapered and/or footed proximate the interface with the metal layer 210. Correction of such conventional tapered and/or footed profiles would be handled via a conventional polysilicon overetch process. However such an overetch would result in the undesirable oxidation of the metal layer 210 due to exposure to the polysilicon overetch process. The oxidized surface of the metal layer 210 would then need to be broken through, typically via higher bias power in the metal layer etch process and/or use of aggressive fluorine chemistries, which may result in punch-through of the oxide layer 202 beneath the PMOS stack 206. Moreover, the remaining polysilicon in the opening 224 being formed in the polysilicon layer 222 would be removed during any polysilicon overetch process, thereby exposing the oxide layer 202 beneath the PMOS stack 206. The metal layer 210 etch process would then need to be very selective to the oxide layer 202 beneath the PMOS stack 206 to avoid punch-through. However, as discussed above, the need to break through the oxidized surface of the metal layer 210 makes this very difficult to achieve.

Accordingly, in some embodiments of the present invention, an improved soft landing 124 provides for maintaining the profiles of the opening 220 being etched into the NMOS stack 204 upon reaching the interface of the polysilicon layer 212 and the metal layer 210 in the NMOS stack 204, advantageously eliminating the need for polysilicon overetching or other measures to correct any footing and/or tapered profiles and further advantageously avoiding oxidation of the surface of the metal layer 210 and the problems attendant thereto. For example, maintaining a cleaner, straighter etch front without the use of conventional polysilicon overetching processes advantageously removes reliance upon a fluorine-based breakthrough process prior to transitioning to the metal layer etch process. Alternatively, in some embodiments, the main etch 122 may be extended to reach the interface of the polysilicon layer 212 and the metal layer 210 in the NMOS stack 204, thereby eliminating the soft landing process altogether.

In some embodiments of the present invention, the soft landing 124 may be similar to the main etch 122 with a reduction in the flow of oxygen ($O_2$), addition of chlorine ($Cl_2$), or utilizing lower total flow and power in the etch reactor. For example, one illustrative process provides HBr at a rate of between about 200 to about 400 sccm (or about 200 sccm) and $O_2$ at a rate of between about 0 to 10 sccm (or between about 0 to 5 sccm), applies between about 200 to 800 W (or about 400 W) of source power and between about 30 to 80 W (or about 40 W) of bias power, and maintains a process pressure of between about 4 to 20 mTorr (or about 4 mTorr) and temperature of between about 50 to 75 degrees Celsius. Optionally, between about 0 to 100 sccm of Cl2 may also be provided.

In some embodiments, a fluorinated chemistry (such as $SF_6$/$CH_2F_2$, similar as discussed above with respect to the main etch 122) may also be used in the soft landing process. The fluorinated chemistry may facilitate a sharper (less footed) etch front that still avoids the fluorine-based breakthrough process prior to transitioning to the metal layer etch process.

Upon conclusion of the soft landing 124, or the polysilicon etch at 120, a quantity of polysilicon 222 will remain in the opening 224 being etched in the PMOS stack 206 due to the conclusion of the process upon reaching the metal layer 210 in the NMOS stack 204. In addition, upon conclusion of the polysilicon etch 120, residual polysilicon 212 may be disposed in the opening 220 of the NMOS stack 204, for example, at the soft landing end point.

Figure 2C:
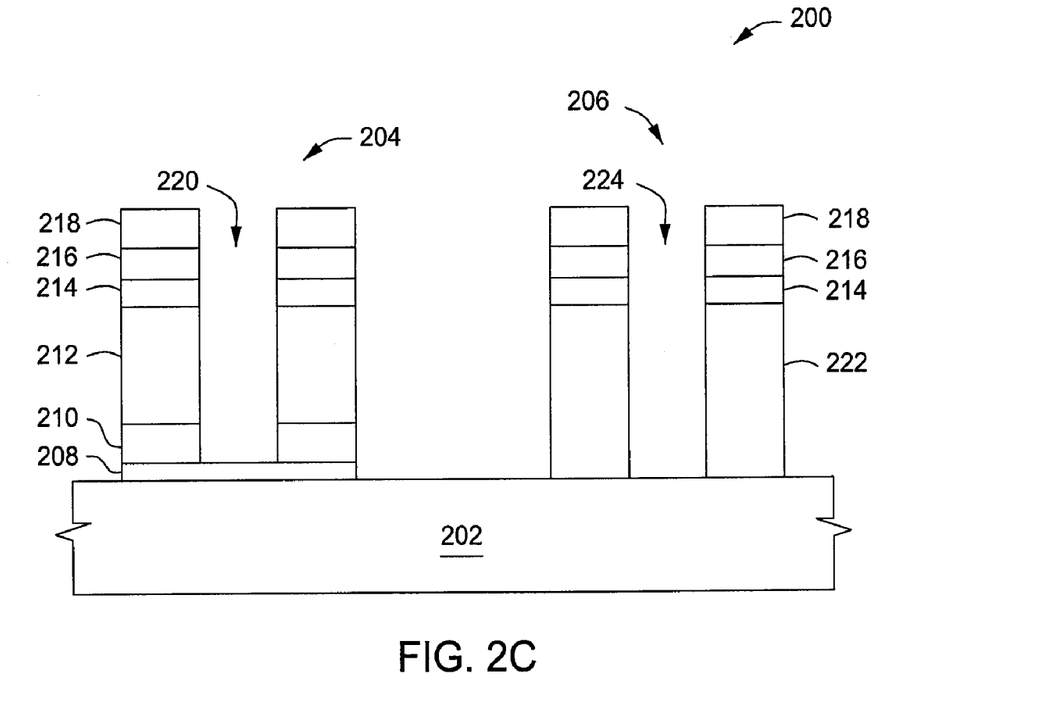

Next, at 130, the portion of the metal layer 210 in the NMOS stack 204 exposed through the opening 220 and the remaining portion of the polysilicon layer 222 in the PMOS stack 206 exposed through the opening 224 are etched. In some embodiments, the metal etch process may be selected to have a high selectivity to the oxide layer 202. In addition, the metal etch process may have a selectivity over polysilicon that is greater than or equal to one, thereby ensuring removal of the metal layer 210 prior to reaching the oxide layer 202 beneath the polysilicon 222 of the PMOS stack 206. For example, a selectivity for metal over polysilicon of greater than one facilitates faster etching of the metal layer 210 in the NMOS stack 204 as compared to the remaining polysilicon layer 222 in the PMOS stack 206, thereby increasing the punch though margin of the PMOS stack 206. In addition, the selectivity of metal over polysilicon should not be too high, thereby preventing residual polysilicon in the NMOS stack 204 from undesirably micro-masking the underlying metal layer 210. In some embodiments, the metal etch process has a selectivity of metal over polysilicon between one and six. In some embodiments, the metal etch process has a selectivity of metal over polysilicon that is slightly greater than 1 (e.g., greater than 1 and less than 2, or between 1 and 1.5).

In some embodiments, a chlorine-based chemistry may be utilized. Chlorine ($Cl_2$) may be provided at a rate of about 20 to 200 sccm. Optionally, dilution gases such as Argon (Ar) and/or Helium (He), or the like may be provided at a rate of about 50 to 300 sccm. In some embodiments, hydrogen bromide (HBr) may be provided at a rate of 0 to 50 sccm to facilitate maintaining an acceptable sidewall profile. The source power may range between about 200 to 700 W, the bias power may range between about 0 to 70 W, the pressure may be maintained between about 4 to 20 mTorr, and the temperature may be maintained between about 30 to 70 degrees Celsius.

The metal layer 210 is generally etched until the high-k dielectric layer 208 of the NMOS stack 204 is reached. The etch process generally provides for etching the polysilicon layer 222 down to the oxide layer 202 in the PMOS stack 206 at substantially the same time. In some embodiments, the selectivity of the metal etch process over silicon oxide may be controlled via utilization of a low bias power (for example, from about 0 to about 40 Watts of bias power) in order to prevent punch through of the oxide layer 202 exposed via opening 206 in the PMOS stack 206.

One illustrative process provides $Cl_2$ at a rate of about 80 sccm, Ar at a rate of about 200 sccm, applies about 500 W of source power and about 20 W of bias power, maintains a substrate temperature of about 60 degrees Celsius, and a pressure of about 8 mTorr. In some embodiments, the process may have a duration of about 30 seconds. Such a process may provide a selectivity for the metal layer 210 over the high-k dielectric layer 208 of greater than 15 and a selectivity for the polysilicon layer 222 over the oxide layer 202 of greater than 15.

Next, at 140, a polysilicon overetch may be performed. The polysilicon overetch cleans out any polysilicon remaining in the respective openings 220, 224 of the NMOS and PMOS stacks 204, 206 (e.g., at the interface between the polysilicon layer 212 and the metal layer 210 and any residue on the exposed portions of the high-k gate dielectric layer 208 in the NMOS stack 204, and at the interface between polysilicon layer 222 and oxide layer 202 in the PMOS stack 206). The polysilicon overetch has a suitable selectivity over the high-k dielectric layer 208, thereby utilizing the high-k dielectric layer 208 as an etch stop layer. In addition, the polysilicon overetch has a suitable selectivity over the oxide layer 202, thereby preventing punch through of the oxide layer 202.

In some embodiments, the polysilicon overetch process may be a less aggressive polysilicon etch process than the polysilicon main etch described above, that removes the remaining polysilicon without substantially etching the sidewalls of the feature (e.g., openings 220, 224). The polysilicon overetch process may generally utilize similar etch chemistry and process conditions as the main etch process described above with respect to 122. In some embodiments, the etch chemistry and process conditions may be selected to reduce the polysilicon etch rate.

For example, one illustrative process provides HBr at a flow rate of between about 100 to about 400 sccm (or about 150 sccm), He at a flow rate of between about 0 to about 300 sccm (or about 100 sccm), and $HeO_2$ at a flow rate of between about 0 to about 20 sccm (or about 10 sccm), applies between about 200 to about 800 W (or about 300 W) of source power and between about 100 to 200 W (or about 100 W) of bias power, maintains a substrate temperature of about 60 degrees Celsius, and a pressure of between about 50 to 80 mTorr (or about 70 mTorr). In some embodiments, the process may have a duration of about 40 seconds or until the polysilicon remainder is satisfactorily removed.

Figure 2D:
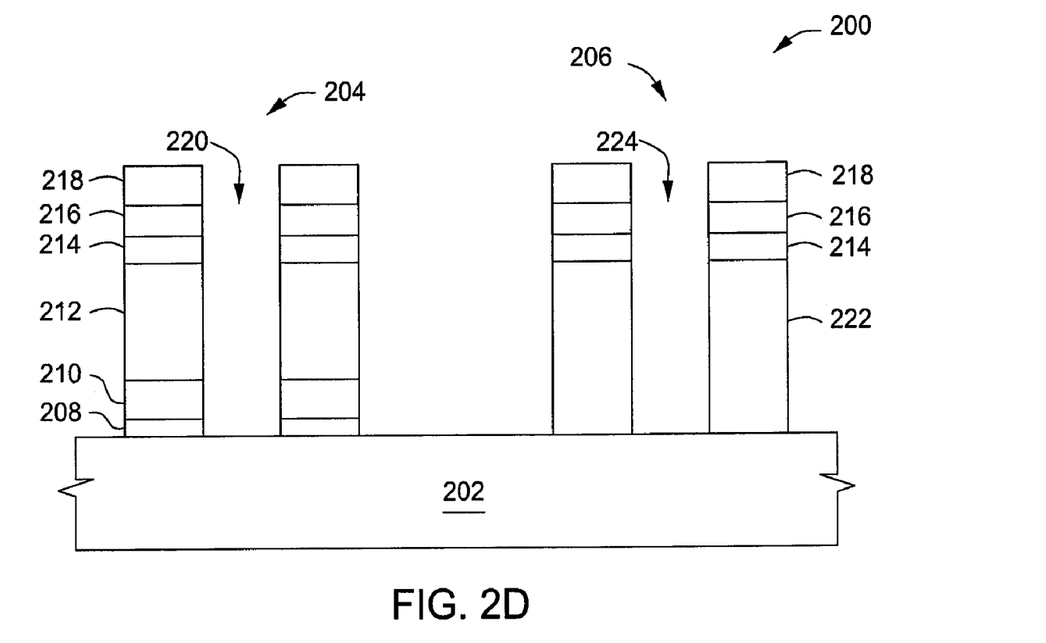

Next, at 150, the high-k gate dielectric layer 208 in the NMOS stack 204 is etched to extend the opening 220 down to the oxide layer 202. The high-k gate dielectric layer 208 may be etched used a chemistry that has high selectivity over silicon oxide and silicon to prevent detrimentally affecting the opening 224 and to prevent punch through of the oxide layer 202 in the PMOS stack 206. In addition, if the oxide layer 202 is inadvertently etched away during the high-k etch, the process still has high enough selectivity over the underlying silicon substrate (not shown) to prevent silicon recess formation.

Examples of suitable methods for etching high-k dielectric layers with high selectivity over silicon oxide, silicon nitride, and silicon are disclosed in U.S. patent application Ser. No. 11/736,562, filed Apr. 17, 2007 by Mani, et al., and entitled, "Etching of $SiO_2$ with High Selectivity to $Si_3N_4$ and Etching Metal Oxides with High Selectivity to $SiO_2$ at Elevated Temperatures with $BCl_3$ Based Etch Chemistries," which is hereby incorporated by reference in its entirety.

In some embodiments, the high-k gate dielectric layer 208 may be etched using a plasma formed from a process gas comprising boron trichloride ($BCl_3$). The boron trichloride ($BCl_3$) etch chemistry has a high selectivity over silicon oxide ($SiO_2$), silicon nitride ($Si_3N_4$), and silicon (Si). In some embodiments, the high-k gate dielectric layer 208 may be etched with a selectivity over silicon oxide of greater than about 10:1. Additionally, the above process may advantageously provide improved vertical high-k sidewall profiles, zero source drain silicon recesses, residue free etching, and high selectivity over nitride or oxide material layers.

In some embodiments, boron trichloride ($BCl_3$) may be provided at a process gas flow rate of between about 50-500 sccm. The boron trichloride ($BCl_3$) may be diluted with one or more inert gases, such as argon (Ar), nitrogen ($N_2$), helium (He), xenon (Xe), or the like, and/or with one or more passivant gases, such as nitrogen ($N_2$), oxygen ($O_2$), methane ($CH_4$), or the like. For example, boron trichloride ($BCl_3$) may be diluted with about 50-500 sccm of argon (Ar) to provide a ratio of Ar:$BCl_3$ ranging between about 1:5-5:1.

The substrate temperature may be maintained between about 100-350 degrees Celsius. In some embodiments, the substrate temperature may be maintained between about 175-225 degrees Celsius, or approximately 220 degrees Celsius.

The pressure in the processing chamber may be maintained between about 4-50 mTorr and a source power may be applied to the inductively coupled plasma to facilitate forming the plasma. The source power may range between about 200-1000 Watts. In some embodiments, the source power may range from about 200-600 Watts, or approximately 400 Watts. In some embodiments, no bias power is applied.

The above etch processes may be controlled by either measuring the etch time or by using a end-point detection scheme. Upon completion of 140, the process ends and the substrate may be further processed as necessary.

The processes described herein may be performed in an integrated etch processing system that includes a vacuum transfer chamber having processing chambers coupled thereto that are suitable for etching metal, polysilicon and high-k material layers present in a gate film stack. In some embodiments, the integrated etch processing system may include a first processing chamber configured to perform a polysilicon etch process, a second processing chamber configured to perform a metal etch process, a third processing chamber configured to perform a high-k dielectric etch process, and a fourth processing chamber configured to perform at least one of a halogen abatement, strip, or passivation process. Embodiments of an exemplary processing apparatus is described in U.S. Provisional Patent Application Ser. No. 60/948,376, filed Jul. 6, 2007, which is incorporated by reference in its entirety.

Figure 3:
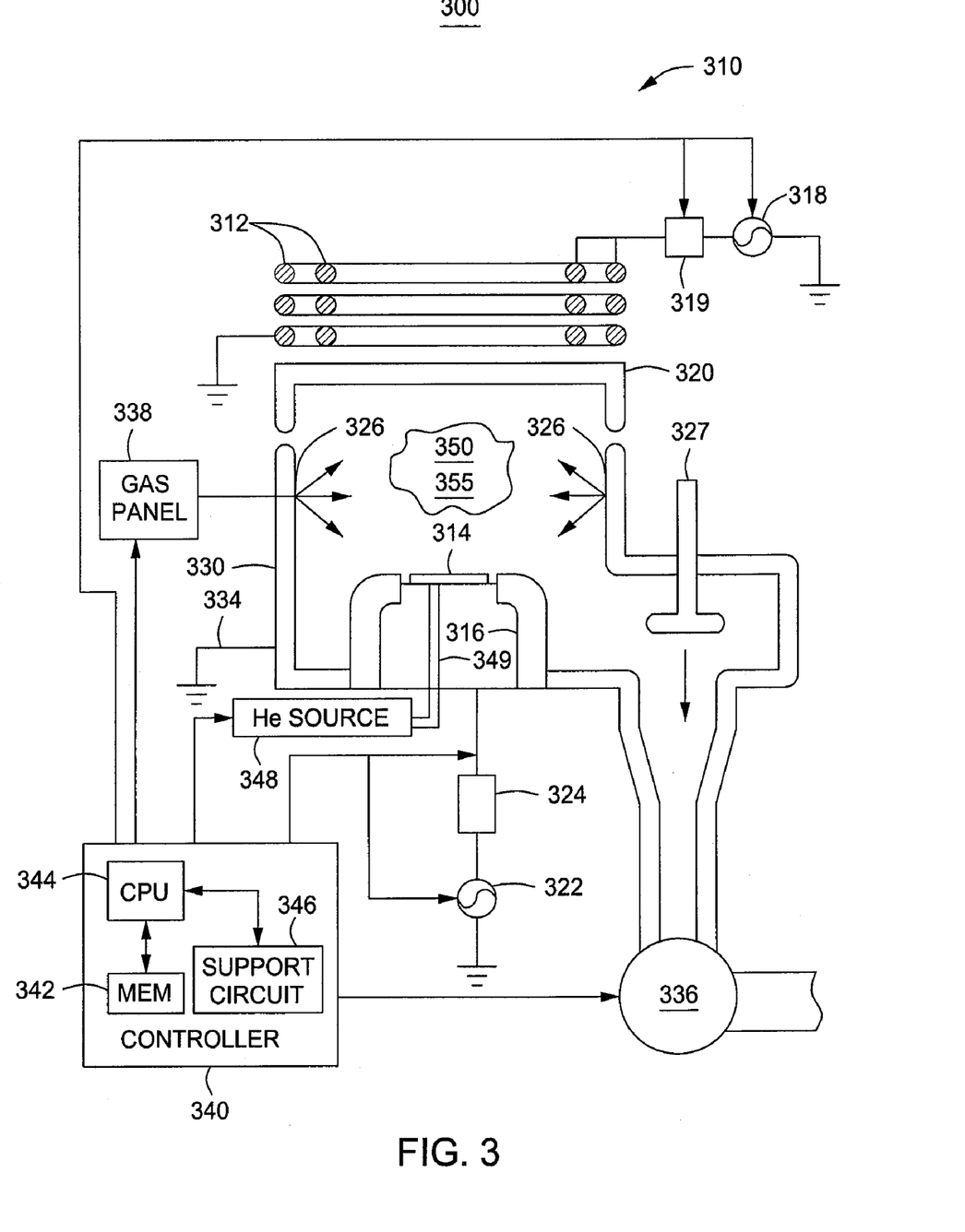
FIG. 3 depicts an etch reactor suitable for performing portions of the present invention.

The processes described herein may also be preformed in other integrated etch processing systems. For example, FIG. 3 depicts a schematic diagram of an illustrative etch reactor 300 of the kind that may be used to practice embodiments of the invention as discussed herein. The reactor 300 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 300 include the ADVANTEDGE™ line of etch reactors (such as the AdvantEdge S or the AdvantEdge HT), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well.

The reactor 300 comprises a process chamber 310 having a substrate support pedestal 316 within a conductive body (wall) 330, and a controller 340. The chamber 310 may be supplied with a substantially flat dielectric ceiling 320. Alternatively, the chamber 310 may have other types of ceilings, e.g., a dome-shaped ceiling. An antenna comprising at least one inductive coil element 312 is disposed above the ceiling 320 (two co-axial elements 312 are shown). The inductive coil element 312 is coupled to a plasma power source 318 through a first matching network 319. The plasma source 318 typically is capable of producing up to 3000 W at a tunable frequency in a range from 50 kHz to 13.56 MHz.

The support pedestal (cathode) 316 is coupled, through a second matching network 324, to a biasing power source 322. The biasing source 322 generally is capable of producing up to 1500 W at a frequency of approximately 13.56 MHz. The biasing power may be either continuous or pulsed power. In other embodiments, the biasing power source 322 may be a DC or pulsed DC source.

A controller 340 comprises a central processing unit (CPU) 344, a memory 342, and support circuits 346 for the CPU 344 and facilitates control of the components of the chamber 310 and, as such, of the etch process, as discussed below in further detail.

In operation, a semiconductor substrate 314 is placed on the pedestal 316 and process gases are supplied from a gas panel 338 through entry ports 326 and form a gaseous mixture 350. The gaseous mixture 350 is ignited into a plasma 355 in the chamber 310 by applying power from the plasma source 318 and biasing power source 322 to the inductive coil element 312 and the cathode 316, respectively. The pressure within the interior of the chamber 310 is controlled using a throttle valve 327 and a vacuum pump 336. Typically, the chamber wall 330 is coupled to an electrical ground 334. The temperature of the wall 330 is controlled using liquid-containing conduits (not shown) that run through the wall 330.

The temperature of the substrate 314 is controlled by stabilizing a temperature of the support pedestal 316. In one embodiment, the helium gas from a gas source 348 is provided via a gas conduit 349 to channels (not shown) formed in the pedestal surface under the substrate 314. The helium gas is used to facilitate heat transfer between the pedestal 316 and the substrate 314. During processing, the pedestal 316 may be heated by a resistive heater (not shown) within the pedestal to a steady state temperature and then the helium gas facilitates uniform heating of the substrate 314. Using such thermal control, the substrate 314 may be maintained at a temperature of between about 0-350 degrees Celsius.

Other etch chambers may be used to practice the invention, including chambers with remote plasma sources, electron cyclotron resonance (ECR) plasma chambers, and the like.

To facilitate control of the process chamber 310 as described above, the controller 340 may be one of any form of general-purpose computer processor that can be used in an industrial setting for controlling various chambers and subprocessors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as a software routine. The software routine may also be stored and/or executed by a second CPU (not shown) that is remotely located from the hardware being controlled by the CPU 344.

The invention may be practiced using other semiconductor substrate processing systems wherein the processing parameters may be adjusted to achieve acceptable characteristics by those skilled in the art by utilizing the teachings disclosed herein without departing from the spirit of the invention.

Thus, methods of forming CMOS logic gate structures have been provided herein. Specifically, methods of simultaneously forming NMOS and PMOS structures in CMOS logic gate applications have been disclosed. Although the forgoing discussion referred to fabrication of CMOS logic gates, other devices or application may also benefit from embodiments of the invention as described herein.

While the foregoing is directed to illustrative embodiments of the present invention, other and further embodiments of the invention may be devised without departing from the basic scope thereof, and the scope thereof is determined by the following claims.

The invention claimed is:

1. A method of etching, comprising:
   (a) providing a substrate having a first stack and a second stack disposed thereupon, the first stack comprising a high-k dielectric layer, a metal layer formed over the high-k dielectric layer, and a first polysilicon layer formed over the metal layer, the second stack comprising a second polysilicon layer, wherein the first and second stacks are substantially equal in thickness;
   (b) simultaneously etching a first feature in the first polysilicon layer and a second feature in the second polysilicon layer until the metal layer in the first stack is exposed;
   (c) simultaneously etching the metal layer and second polysilicon layer to extend the respective first and second features into the first and second stacks; and
   (d) etching the high-k dielectric layer.

2. The method of claim 1, wherein the substrate further comprises an oxide layer disposed between the substrate and the first and second stacks.

3. The method of claim 2, wherein the first stack comprises an NMOS stack and wherein the second stack comprises a PMOS stack.

4. The method of claim 2, wherein the high-k dielectric layer comprises hafnium (Hf) and the metal layer comprises at least one of tantalum (Ta), titanium (Ti), tungsten (W), nitrides thereof (TaN, TiN, WN), or tantalum carbide (TaC).

5. The method of claim 2, wherein the high-k dielectric layer is between about 10-100 Angstroms thick and the metal layer is between about 70-200 Angstroms thick.

6. The method of claim 2, wherein the first polysilicon layer is between about 600-1200 Angstroms thick and the second polysilicon layer is between about 700-1200 Angstroms thick.

7. The method of claim 2, wherein (b) further comprises:
   etching the first and second polysilicon layers in a main etch; and
   etching the first and second polysilicon layers in a soft landing different from the main etch by at least one of a reduced flow of an oxygen ($O_2$) gas, an addition of a chlorine ($Cl_2$) gas, or the use of a lower total flow and power than the main etch.

8. The method of claim 2, wherein (c) further comprises:
   etching the metal layer and second polysilicon layer with chlorine ($Cl_2$).

9. The method of claim 8, wherein the etching process has a selectivity of metal over polysilicon of greater than 1 and less than 2.

10. The method of claim 1, wherein a hard mask layer, a bottom anti-reflection coating (BARC) layer, and a resist layer is formed and patterned atop the NMOS and PMOS stacks.

11. The method of claim 1, further comprising:
    removing excess polysilicon between (c) and (d) via a plasma etch.

12. The method of claim 1, wherein (d) further comprises:
    maintaining the substrate at a temperature of between about 100-350 degrees Celsius; and
    plasma etching the high-k dielectric layer using a process gas comprising boron trichloride ($BCl_3$).

13. The method of claim 12, wherein the substrate temperature is maintained between about 175-225 degrees Celsius.

14. The method of claim 12, wherein the boron trichloride ($BCl_3$) is provided at a flow rate of between about 50-500 sccm.

15. The method of claim 12, wherein the boron trichloride ($BCl_3$) is mixed with at least one of argon (Ar), nitrogen ($N_2$), helium (He), xenon (Xe), oxygen ($O_2$), or methane ($CH_4$).

16. The method of claim 12, wherein the high-k gate dielectric layer is etched with a selectivity over silicon oxide of greater than about 10:1.

17. A method of fabricating a CMOS logic gate, comprising:
    (a) providing a silicon substrate having an oxide layer and an NMOS stack and a PMOS stack disposed upon the oxide layer, the NMOS stack comprising a high-k dielectric layer formed over the oxide layer, a metal layer formed over the high-k dielectric layer, and a first polysilicon layer formed over the metal layer, the PMOS stack comprising a second polysilicon layer formed over the oxide layer, the NMOS and PMOS stacks substantially equal in thickness;
    (b) simultaneously etching a first feature in the first polysilicon layer and a second feature in the second polysilicon layer until the metal layer is exposed;
    (c) simultaneously etching the metal layer and second polysilicon layer to extend the respective first and second features into the NMOS and PMOS stacks;
    (d) plasma etching excess polysilicon in the NMOS and PMOS stacks; and
    (e) etching the high-k dielectric layer.

18. The method of claim 17, wherein the high-k dielectric layer comprises hafnium and wherein the metal layer comprises at least one of tantalum (Ta), titanium (Ti), tungsten (W), nitrides thereof (TaN, TiN, WN), or tantalum carbide (TaC).

19. The method of claim 17, wherein the high-k dielectric layer is between about 10-100 Angstroms thick and the metal layer is between about 70-200 Angstroms thick.

20. The method of claim 17, wherein the first polysilicon layer is between about 600-1200 Angstroms thick and the second polysilicon layer is between about 700-1200 Angstroms thick.

21. The method of claim 17, wherein a hard mask layer, a bottom anti-reflection coating (BARC) layer, and a resist layer is formed and patterned atop the NMOS and PMOS stacks.

22. The method of claim 21, wherein the hard mask layer comprises at least one of silicon oxide ($SiO_2$), silicon oxynitride (SiON), or silicon nitride ($Si_3N_4$).

23. The method of claim 17, wherein (b) further comprises:
    etching the first and second polysilicon layers in a main etch; and
    etching the first and second polysilicon layers in a soft landing different from the main etch by at least one of a reduced flow of an oxygen ($O_2$) gas, an addition of a chlorine ($Cl_2$) gas, or the use of a lower total flow and power than the main etch.

24. The method of claim 17, wherein (c) further comprises:
    etching the metal layer and second polysilicon layer with chlorine ($Cl_2$).

25. The method of claim 24, wherein the etching process has a selectivity of metal over polysilicon of greater than 1 and less than 2.

26. The method of claim 17, wherein (e) further comprises:
    maintaining the substrate at a temperature of between about 100-350 degrees Celsius; and
    plasma etching the high-k dielectric layer using a process gas comprising boron trichloride ($BCl_3$).

27. The method of claim 26, wherein the substrate temperature is maintained between about 175-225 degrees Celsius.

28. The method of claim 26, wherein the boron trichloride ($BCl_3$) is provided at a flow rate of between about 50-500 sccm.

29. The method of claim 26, wherein the boron trichloride ($BCl_3$) is mixed with at least one of argon (Ar), nitrogen ($N_2$), helium (He), xenon (Xe), oxygen ($O_2$), or methane ($CH_4$).

30. The method of claim 26, wherein the high-k gate dielectric layer is etched with a selectivity over silicon oxide of greater than about 10:1.

* * * * *